(12) United States Patent
Pernau et al.

(10) Patent No.: US 10,636,934 B2
(45) Date of Patent: Apr. 28, 2020

(54) METHOD AND DEVICE FOR PASSIVATING DEFECTS IN SEMICONDUCTOR SUBSTRATES

(71) Applicant: CENTROTHERM INTERNATIONAL AG, Blaubeuren (DE)

(72) Inventors: Thomas Pernau, Blaubeuren (DE); Peter Völk, Griesingen (DE); Hans-Peter Elser, Ulm (DE); Wolfgang Scheiffele, Erbach (DE); Andreas Reichart, Berghülen (DE); Olaf Romer, Leipzig (DE); Wolfgang Jooss, Constance (DE)

(73) Assignee: CENTROTHERM INTERNATIONAL AG, Blaubeuren (DE)

( * ) Notice: Subject to any disclaimer, the term of this patent is extended or adjusted under 35 U.S.C. 154(b) by 0 days.

(21) Appl. No.: 15/762,601

(22) PCT Filed: Sep. 20, 2016

(86) PCT No.: PCT/EP2016/072321
§ 371 (c)(1),
(2) Date: Mar. 23, 2018

(87) PCT Pub. No.: WO2017/050772
PCT Pub. Date: Mar. 30, 2017

(65) Prior Publication Data
US 2018/0277710 A1    Sep. 27, 2018

(30) Foreign Application Priority Data

Sep. 23, 2015 (DE) .................. 10 2015 012 323

(51) Int. Cl.
*H01L 31/18* (2006.01)
*H01L 21/67* (2006.01)
*H01L 21/322* (2006.01)

(52) U.S. Cl.
CPC ...... *H01L 31/1868* (2013.01); *H01L 21/3221* (2013.01); *H01L 21/67109* (2013.01);
(Continued)

(58) Field of Classification Search
CPC .................. H01L 31/1868; H01L 21/3221
(Continued)

(56) References Cited

U.S. PATENT DOCUMENTS

4,698,486 A    10/1987 Sheets
2009/0214193 A1    8/2009 Suzuki et al.
(Continued)

*Primary Examiner* — Jami Valentine Miller
(74) *Attorney, Agent, or Firm* — Tarolli, Sundheim, Covell & Tummino LLP (57) ABSTRACT

The invention relates to methods and an apparatus for passivating defects of a semiconductor substrate, in particular a silicon based solar cell. According to the method, the substrate is irradiated with electromagnetic radiation during a first process phase, wherein the radiation directed onto the substrate has wavelengths at least in the region below 1200 nm and an intensity of at least 8000 Watt/m2. This can lead to a heating of the substrate, or a temperature control can be provided. Subsequently, the substrate is irradiated with electromagnetic radiation during a temperature-holding phase following the first process phase, wherein the radiation directed onto the substrate has wavelengths primarily in the region below 1200 nm and an intensity of at least 8000 Watt/m2, while a side of the substrate facing away from a source of the electromagnetic radiation is cooled via a contact with a support cooled by a cooling device.

28 Claims, 2 Drawing Sheets

(52) U.S. Cl.
CPC .. *H01L 21/67115* (2013.01); *H01L 21/67173* (2013.01); *H01L 31/1876* (2013.01); *Y02E 10/50* (2013.01); *Y02P 70/521* (2015.11)

(58) Field of Classification Search
USPC .......................................................... 438/58
See application file for complete search history.

(56) References Cited

U.S. PATENT DOCUMENTS

| | | | |
|---|---|---|---|
| 2013/0102129 A1* | 4/2013 | Falster | H01L 31/1804 438/471 |
| 2015/0087085 A1 | 3/2015 | Rick et al. | |
| 2015/0111333 A1* | 4/2015 | Wenham | H01L 31/1864 438/58 |
| 2015/0132881 A1* | 5/2015 | Wenham | H01L 31/1864 438/58 |

* cited by examiner

METHOD AND DEVICE FOR PASSIVATING DEFECTS IN SEMICONDUCTOR SUBSTRATES

RELATED APPLICATIONS

This application corresponds to PCT/EP2016/072321, filed Sep. 20, 2016, which claims the benefit of German Application No. 10 2015 011 177.9, filed Aug. 27, 2015, the subject matter, of which are incorporated herein by reference in their entirety.

BACKGROUND OF THE INVENTION

The following invention relates to a method and an apparatus for passivating defects in semiconductor substrates, in particular silicon-based semiconductor substrates for photovoltaic elements.

Photovoltaic elements serve to convert light directly into electrical energy. For this purpose, on a p-type or n-type semiconductor an area with a respective opposite type doping is formed to form a p-n junction. When illuminated with light, charge carrier pairs are generated, which are spatially separated by a potential gradient formed by the p-n junction. The separate charge carriers can then be passed through the semiconductor and fed to an external circuit.

Photovoltaic elements, also referred to as solar cells, often use crystalline silicon as the semiconductor, wherein it is distinguishing between poly- or multi-crystalline silicon (poly-Si) and mono-crystalline silicon (mono-Si). Although higher efficiencies can typically be achieved with mono-Si, the production process of mono-Si over poly-Si is more complex and energy-intensive. In the frequently used Czochralski method, boron doping is also commonly used to produce a p-type semiconductor. Inevitably, oxygen atoms are also incorporated into the silicon crystal during production.

However, the boron atoms in combination with the oxygen atoms tend to form electrical defects also known as traps, which can adversely affect the electrical properties of the solar cells. In particular, a substantial reduction in the efficiency of a solar cell was found at high boron and/or oxygen concentrations. This is especially the case when the solar cells are illuminated for a long time, as this activates the B—O-complexes as recombination centers. One therefore also calls this effect "Light-Induced Degradation". However, also other defects, such as defects in the crystal lattice, and metallic impurities, such as occur more frequently in poly-Si, can significantly reduce the efficiency of a solar cell under working conditions.

The problem of light-induced degradation in mono-crystalline CZ-Si is known in the art and has already been explained in detail in German patent application DE 10 2006 01920 A1. In this application, a method for stabilizing the efficiency of a Si solar cell with boron doping was proposed, in which the substrate was illuminated with light of a wavelength of less 1180 nm while the substrate was at a temperature of 50-230° C. The illumination leads to the generation of excess charge carriers and in particular also to a change in the electrical state of hydrogen H contained in the silicon crystal. In particular, the concentration of the neutral ($H^0$) species of the hydrogen atoms is increased, which enables a passivation of uncharged defects in the crystal structure, such as boron-oxygen defects. A similar process would also take place in multi-crystalline Si, leading to the passivation of defects.

The above process has led to a stabilization of the efficiency of silicon solar cells, but is very time-consuming to achieve a long-term stabilization. The inventors have found that much higher radiation intensities than proposed in DE 10 2006 01920 A1 are advantageous for the generation of charge carriers (and a complete formation of the defects which are then to be passivated), but also found that the higher radiation intensities can also lead to temperature problems even though higher temperatures than those specified in DE 10 2008 01920 A1 are also being taken into consideration.

Starting from the known method, it is therefore an object the present invention to provide an improved method and apparatus for the passivation of defects in silicon, such as the regeneration of semiconductor substrates.

SUMMARY OF THE INVENTION

According to the invention this object is achieved by a method and an apparatus according to the claims.

A first method for passivating defects of a semiconductor substrate, in particular a silicon-based solar cell, is provided, which method comprises the steps of: heating the substrate during a heating phase by means of at least electromagnetic radiation, wherein the radiation directed onto the substrate has at least wavelengths in a range below 1200 nm and an intensity of at least 8000 Watt/$m^2$, irradiating the substrate with electromagnetic radiation during a temperature-holding phase following the heating phase, wherein the radiation directed onto the substrate has wavelengths primarily in the range below 1200 nm and an intensity of at least 8000 Watt/$m^2$, cooling a side of the substrate facing away from a source of electromagnetic radiation during the temperature-holding phase via a contact with a support, which is cooled by a cooling device. Here, the term "wavelengths primarily below 1200 nm" is intended to express that less than 40% of the total intensity of the radiation is generated by wavelengths above 1200 nm. Wavelengths in the range 450-1200 nm are preferred. The method according to the invention, which in particular also includes regeneration in the term passivation, offers the advantage of rapid heating in an initial phase and the possibility of using high intensity illumination during a temperature-holding phase, whereby overheating of the substrate by the radiation is prevented by an active contact cooling. Furthermore, at least in the temperature-holding phase, the radiation is limited primarily to a charge carrier-generating region of the wavelengths. The term temperature-holding phase is not intended to necessarily describe a constant temperature, rather, a further—but less strong—increase in temperature or even a cooling during this phase is possible. The temperature of the substrate should rather be kept within a temperature range.

In a second method for passivating defects of a semiconductor substrate, in particular a silicon-based solar cell, the following steps are provided: controlling the temperature of the substrate during a first process phase via contact with a temperature controlled support, while electromagnetic radiation is directed onto the substrate, wherein the radiation directed onto the substrate has at least wavelengths in the range below 1200 nm and an intensity of at least 8000 Watt/$m^2$; irradiating the substrate with electromagnetic radiation during a temperature-holding phase following the first process phase, wherein the radiation directed onto the substrate has wavelengths primarily in the range below 1200 nm and an intensity of at least 8000 Watt/$m^2$; cooling a side of the substrate feeing away from a source of the electromagnetic radiation during the temperature-holding phase via a contact with a support which is cooled by a cooling device. The second method according to the invention, which especially includes a regeneration under the term passivation, offers the advantage of illuminating the substrate in an initial phase with high intensity, while the temperature controlled support allows the substrate to obtain or maintain a desired temperature. While in the first method it is assumed that the substrate first has to be heated to the temperature of the temperature-holding phase, the second method considers that heating is not necessary in the first process phase since different starting situations with regard to the temperature of the substrate may be present. In this respect, the temperature control unit, through which, for example, a medium having a desired temperature may flow, allows heating of the substrate, maintaining the temperature of the substrate or even cooling of the substrate, depending on the temperature with which the substrate enters the process. If the substrate for example comes from a firing oven process and thus has an elevated temperature, maintaining the temperature or even a cooling of the substrate may be required. When the substrate comes from storage it usually does not have an elevated temperature and would require heating. The temperature control unit can thus achieve a certain temperature at the end of the first process phase, independently of the initial temperature of the substrate. Otherwise, the above-mentioned advantages also apply here.

In one embodiment of the second method, during the first process phase the substrate is irradiated with electromagnetic radiation having wavelengths primarily in the range below 1200 nm.

Preferably, the temperature-holding phase is followed by a cooling phase in which the substrate is cooled at least via contact with a support, which is cooled by a cooling device, while the substrate is further irradiated with electromagnetic radiation having wavelengths primarily in the range below 1200 nm. Due to the active contact cooling, good cooling can still be achieved even if radiation is still irradiated onto the substrate, wherein the radiation in the cooling phase can be substantially reduced. For example, the radiation can be reduced to 3000 Watt/m² or even to 1000 Watt/m².

In one embodiment, in the heating phase, the electromagnetic radiation has a substantial portion of radiation having wavelengths above 1200 nm, wherein substantial in this context comprises a portion of the total radiation intensity of at least 50%. In addition to generating charge carriers which are primarily generated at wavelengths below 1200 nm, wavelengths above 1200 nm are also used here, which primarily cause heating of the substrate. Radiant heating is typically more effective than other types of heating, such as heating via hot plates, provided that there is adequate absorption of the radiation of >1200 nm, for example by a metal coating on solar cells.

The intensity of the electromagnetic radiation in the heating phase and/or the temperature-holding phase is preferably at least 9000 Watt/m², in particular at least 10000 Watt/m². The inventors have found that a higher radiation intensity may be advantageous both in terms of process speed and complete passivation. The intensity is limited primarily by the available radiation source and the maximum temperature, which should ideally not be exceeded by the substrate. The intensity of the radiation may be higher during the heating phase than during the temperature-holding phase, in particular by at least a factor of 1.3. Also, the intensity of the radiation during the temperature-holding phase may be higher than during the cooling phase, in particular again by at least a factor of 1.3. Such a stepwise decrease of the intensity may be beneficial if overheating would otherwise be imminent, or if the cooling would have to be dimensioned larger, but the decrease is not mandatory.

For targeted temperature control, the substrata can additionally be temperature controlled during the heating phase via contact with a temperature controlled support, which is temperature controlled by a temperature control device.

For the heating phase, the temperature-holding phase and/or the cooling phase, the same type of radiation source can be used, while in the temperature-holding phase and/or the cooling phase, preferably at least part of the spectrum of the radiation source is filtered out, so that the radiation falling onto the substrate has wavelengths primarily below 1200 nm. Alternatively, it is also possible to use different types of radiation sources for the heating phase, the temperature maintenance phase and/or the cooling phase.

The apparatus is suitable for passivating defects of a semiconductor substrate, in particular of a silicon-based solar cell, and comprises: a continuous furnace having an elongated process space, which forms at least three zones arranged in the sequence of a heating zone, a temperature-holding zone and a cooling zone, at least one transport unit for receiving the substrate and for transporting the substrate successively through the zones of the process space, at least one first radiation source for electromagnetic radiation, which is arranged adjacent to the heating zone of the process space such that it may radiate electromagnetic radiation onto a section of the transport unit located in the heating zone and which is configured to generate radiation having wavelengths at least in the range below 1200 nm and an intensity of at least 8000 Watt/m²; at least one second radiation source for electromagnetic radiation, which is arranged adjacent to the temperature-holding zone of the process space such that it may radiate electromagnetic radiation onto a section of the transport unit located in the temperature-holding zone, and which is configured to generate radiation having wavelengths at least in the range below 1200 nm and an intensity of at least 8000 Watt/m², and at least one first cooling unit, which is arranged in the temperature-holding zone of the process space and in heat-conducting contact with the section of the transport unit located in the temperature-holding zone. Such a device is suitable for advantageously carrying out the above method and also permits high-intensity illumination in the temperature-holding zone without the risk of overheating of the substrate.

Preferably, the device comprises at least one third radiation source for electromagnetic radiation, which is arranged adjacent to the cooling zone of the process space such that it can radiate electromagnetic radiation onto a section of the transport unit located in the cooling zone, and which is configured to generate radiation having wavelengths at least in the range below 1200 nm, and at least one second cooling unit, which is arranged in the cooling zone of the process chamber and is in heat-conducting contact with the section of the transport unit located in the cooling zone. As a result, further irradiation is possible even during the cooling of the substrate.

In order to reduce the heating of the substrate, radiation that does not primarily contribute to the generation of charge carriers is at least partially filtered out. For this purpose, means are provided between the second and/or third radiation source and the process space, which filters out at least portion of radiation directed Info the process space by the second and/or third radiation source, in particular radiation in a wavelength range above 1200 nm.

For a rapid initial heating, the device may further comprise at least one heating unit, which is arranged in the heating zone of the process chamber and in heat-conducting contact with a section of the transport unit located in the heating zone.

In one embodiment, the transport unit comprises a conveyor belt which is circumferentially guided through the zones of the process space, and which is in sliding contact with at least one plate element in the process space, wherein the at least one plate element is in thermally conductive contact with at least one of the following units: the first cooling unit, the second cooling unit and the heating unit. As a result, transport of the substrates with simultaneous zone-dependent heating/cooling can be ensured in a simple manner. Preferably, the conveyor belt is at least partially received in and guided by the at least one plate member, such as in a recess in the plate member. In one aspect, separate plate elements are provided in at least the heating zone and the temperature-holding zone, which are not in a thermally conductive contact.

In order to be able to provide a sufficiently high cooling capacity, the first cooling unit and/or the second cooling unit are liquid-cooled units.

In one embodiment, the first, second and/or third radiation source comprise at least one halogen lamp and/or a gas discharge lamp which is configured to generate and radiate radiation onto the section of the transport unit located in the respective zone having an intensity of at least 9000 Watt/m$^2$, in particular of at least 10,000 Watt/m$^2$. Such types of lamps permit the required intensities to be achieved with an acceptable efficiency, in particular, intensities of up to 20,000 Watt/m$^2$ can easily be achieved. However, it is also possible to use other radiation sources which provide the required intensities in the required wavelength range.

It is possible that at least two of the first, second and third radiation sources are of a different type. In particular, it is conceivable to provide a radiation source of another type in the area of the cooling zone, since a lower intensity is required here. In particular, it would be possible here to work with LEDs which can be set to operate in the wavelength range below 1200 nm.

BRIEF DESCRIPTION OF THE DRAWINGS

The invention will be explained in more detail with reference to the drawings. In the drawings.

DESCRIPTION

The relative terms used in the following description, such as left, right, top, bottom, refer to the drawings and are not intended to limit the application in any way, even though they describe a preferred arrangement. The term substantially is intended to include deviations of +/−10%, preferably +/−5%.

Figure 1:
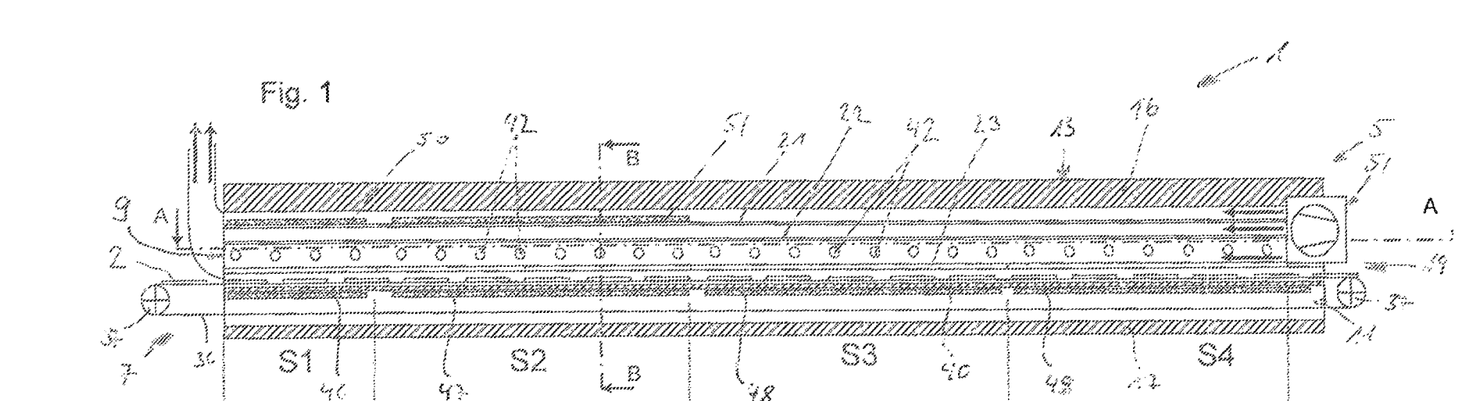
FIG. 1 is a schematic longitudinal sectional view through a regeneration device according to the present invention.

FIG. 1 shows a regeneration device 1 for semiconductor substrates 2, in particular for silicon-based solar cells. The regeneration device 1 consists essentially of a housing unit 5, a transport unit 7, an irradiation unit 9 and a temperature control unit 11.

The housing unit 5 has an outer housing 13 and an inner housing arrangement 14. The outer housing 13 consists essentially of two U-shaped housing elements 16, 17, made of a suitable, temperature-resistant and opaque material such as aluminum or stainless steel. The legs of the U-shape of the housing elements 16, 17 are set onto each other such that a receiving space 19 having a substantially rectangular cross-section is formed between the housing elements. The housing elements 16, 17 are elongated, so that an elongated receiving space is formed between the housing elements 16, 17. The housing elements can be arranged pivotal relative to one another in order to allow a side access to the receiving space 19. Although the housing members 16, 17 are illustrated as extending over the entire length of the receiving space 19, a plurality of housing members may be provided so as to longitudinally segment the receiving space.

The inner housing assembly 14 is arranged within the elongate receiving space 19 and consists in substance of a plurality of horizontal partition elements 21, 22, 23 and 24 and vertical partition elements 26, 27, 28 and 29.

A first horizontal partition element is arranged in the upper region of the housing 16 and extends horizontally between lateral legs of the housing element 16. The horizontal partition element thereby separates an upper portion in the interior of the housing member 16 from the underlying portion. This upper portion, as will be explained in more detail below, forms an upper cooling channel. Below, and spaced from the horizontal partition element 21, a second horizontal partition element 22 is provided. This second horizontal partition element 21 extends over a partial region between the legs of the upper housing member and is supported in this position by vertical partition elements 26, 27. The region between the horizontal partition element 21 and the horizontal partition element 22 forms a central cooling channel 31, and lateral cooling channels 32 are formed laterally with respect to the vertical partition elements 26, 27. Below the horizontal partition element and spaced therefrom, a further horizontal partition element 23 is arranged, wherein the spacing is determined essentially by the vertical partition elements 26, 27. As will be explained in more detail below, a lamp receiving chamber 33 is formed between the horizontal partition elements 22, 23, which chamber 33 also serves as a cooling channel. The lamp receiving chamber is bounded laterally by the vertical partition elements 26, 27. The vertical partition element is transparent to lamp radiation and, in certain cases, may have a filtering function, as will be explained in more detail below.

The horizontal partition element 23 is substantially supported by the vertical partition elements 28, 29 set on the bottom of the lower housing element 17.

Although the horizontal and vertical partition elements are illustrated as extending over the entire length of the receiving space 19, it should be noted that they may be segmented along the length of the receiving space 19 corresponding to a segmentation of the housing members 16, 17. A respective segmentation is already indicated by S1 to S4. It is also possible that, for example, the horizontal partition element 22 is formed integrally with the vertical partition elements 28, 27. Other combinations of partition elements which form a unit are also possible.

Between the lower ends of the vertical partition elements 26, 27 and lateral legs of the lower housing element 17 further horizontal partition elements 24 are provided, which bound the lateral cooling channel 32 at the bottom. A process space 34 is formed between the horizontal partition element 23, the base of the lower housing element 17 and the vertical partition elements 28, 29.

Now, the transport unit 7 will be explained in more detail. The transport unit 7 has a conveyor belt 36, which is guided circumferentially via guide/drive rollers 37. The conveyor belt 36 forms an upper transport section and a lower return section. The conveyor belt 36 is arranged by the guide/drive rollers 37 so that the sections are aligned substantially horizontally and extend through the process space 34.

Figure 2:
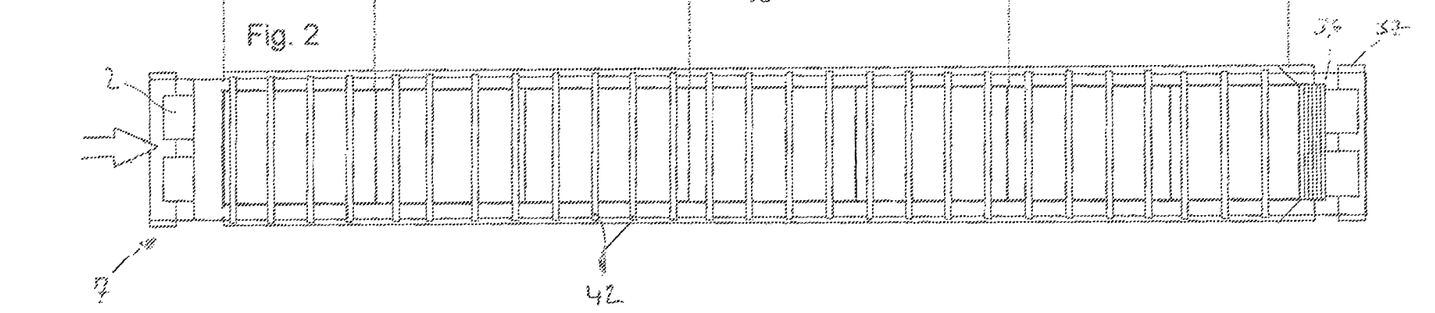
FIG. 2 is a schematic sectional view of the regeneration device according to FIG. 1 along the line A/A in FIG. 1.
Figure 3:
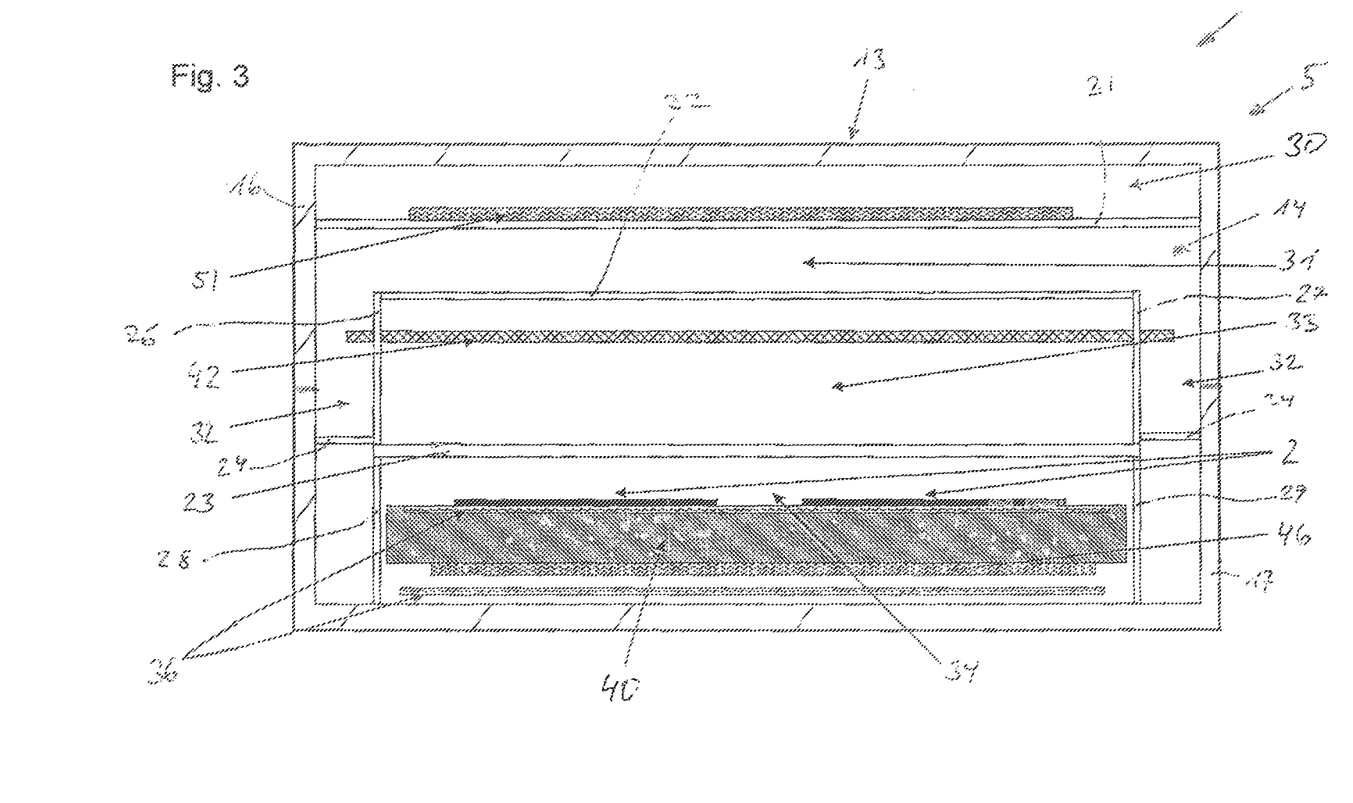
FIG. 3 is a schematic cross-sectional view of the regeneration device according to FIG. 1 along the line B/B in FIG. 1.

The guide/drive rollers 37 are arranged outside of the receiving space, in such a way that the upper transport section of the conveyor belt 36 can be loaded and unloaded, respectively at the respective ends. In the illustration according to FIG. 1, loading is provided on the left side and unloading on the right side. Hence, as shown in FIG. 1, the substrates 2 are conveyed from left to right through the process space 34, as indicated by an arrow in FIG. 2.

The conveyor belt 36 consists essentially of a wire mesh, such as V2A stainless steel and is guided in the process space 34 by a bottom plate 40 and is at least partially received therein. In particular, longitudinal grooves are provided in the bottom plate 40, which receive parts of the wire mesh and thereby provide lateral guidance. In the longitudinal grooves, the wire mesh rests on the bottom plate 40, and drags over the bottom of the groove when moved, thereby providing a good thermal contact between the conveyor belt 36 (wire mesh) and the bottom plate 40. For this purpose, hold-down devices or other means may additionally be provided which prevent lifting off of the conveyor belt 36 from the bottom plate 40.

The materials of the bottom plate and the wire mesh are to be chosen so that little of the least possible abrasion is generated. The bottom plate may for example be made of graphite and must have a sufficiently high strength be able to support the conveyor belt and substrates 2 accommodated thereon. In addition, the bottom plate 40 must be temperature resistant to the temperatures used in the process. Graphite has proven to be suitable in terms of temperature resistance, load capacity, but also in terms of a low coefficient of friction. An alternative material would for example be, aluminum. Since a temperature control (heat input or heat removal) is effected in part via the bottom plate 40 and the conveyor belt 36, good thermal conductivity of the elements is advantageous.

The bottom plate 40 extends over the entire length of the process space 34. Again, a segmentation in the longitudinal direction may be provided, and may be advantageous, as will be explained in more detail below. Segmentation is, for example, again possible in the areas S1 to S4.

The irradiation unit 9 consists in substance of a plurality of longitudinal lamps 42, which extend transversely to the longitudinal extension of the receiving space 19. The longitudinal lamps 42 extend through the vertical partition elements 28, 27 which support the lamps for example in a horizontal alignment. A main portion of the longitudinal lamps 42 passes through the lamp receiving chamber 33, which is bounded by the horizontal vertical partition elements 22, 23 and the vertical partition elements 26, 27. At the ends, the longitudinal lamps can be electrically contacted, as will be apparent to those skilled in the art. As longitudinal lamps, for example, halogen lamps and high-pressure gas discharge lamps can be used. However, it is also possible to use other lamp types, for example based on LEDs or lasers, provided that they can provide sufficient light intensity in the desired spectral range, as will be explained in more detail below. Of course, the shape of the lamps would change accordingly.

In the illustrated embodiment, if is assumed that halogen lamps or high-pressure gas discharge lamps in the form of longitudinal lamps 42 are used. As can be seen in the illustration, the longitudinal lamps are arranged substantially uniformly spaced along the length of the lamp receiving chamber 33. However, it is also possible to change the distances, depending on the requirements with regard to a light intensity in the process space 34. The longitudinal lamps 42 may be controlled in a closed loop manner with respect to the emitted light intensity, as will be explained in mere detail below.

The temperature control unit 11 consists in substance of a heating plate 46, cooling plates 47 to 51 and a fan 52. The heating plate 46 is arranged in the entry region of the process space 34 below the bottom plate 40 and in the thermally conductive contact therewith. This entry region forms a first segment of the process space and is identified as S1. A hot medium can be caused to flow through the heating plate 46 can the heating plate 46 may be heated in another suitable manner in a controlled manner. In particular, the heating plate may comprise a resistance heating element. The heating plate 46 is an optional component that can be dispensed with depending on the configuration and control of the lamps in the region of the first segment S1.

Adjacent to the first segment S1, the process space has a second segment S2. In this second segment, a cooling plate 47 is arranged below and in thermally conductive contact with the bottom plate 40. Corresponding cooling plates 48 and 49 are also provided in segments S3 and S4 which are arranged downstream in the conveying direction of the conveyor belt 36. Further cooling plates 50 and 51 are provided in the upper cooling channel in the segments S1 and S2. Optionally, even further cooling plates may be provided within the upper cooling channel 30, if necessary.

The cooling plates 47 to 49 each have a meandering recess in one side thereof, in which a coolant line is received, through which a coolant, such as a cooling liquid may be caused to flow. A respective flow of coolant is separated for each cooling plate, but it is also possible for the coolant to flow through a plurality of cooling plates. The flow of coolant through the cooling plates is usually against a conveying direction of the conveyor belt 36. Screw-on cooling meanders or other configurations can also be used.

Above the exit region of the process chamber 34, the blower 52 is provided, which for example sucks in ambient air and directs the same against the conveying direction of the conveyor belt through the upper cooling channel 30, the middle cooling channel 31, the lateral cooling channel 32 and the lamp receiving chamber, which also serves as a cooling chamber. This is indicated schematically in the sectional view according to FIG. 1 by corresponding flow arrows. In these channels, there is thus an air cooling of the respective areas. At the entry side, a corresponding exhaust device is provided, which is arranged such that it also provides an at least partial exhaustion of the process space 34, as can be seen from the illustration according to FIG. 1.

The operation of the device and a regeneration method according to the invention will now be explained in more detail.

The process is described in combination with monocrystalline silicon solar cells, which have boron-oxygen defects which are passivated by neutralized hydrogen atoms (H$^0$ species) or negatively charged hydrogen atoms (H$^-$ species). The method is also suitable for passivation of other defects, in particular crystal defects in poly-silicon.

The substrates 2 are first loaded onto the conveyor belt 36 at the input end (on the left in FIG. 1). Two substrates 2 are loaded side by side on the conveyor belt, but it is of course also possible to provide a different arrangement of substrates on the conveyor belt. The arrangement primarily depends on the size of the apparatus 1 and the size of the substrates, as one skilled in the art will recognize.

The substrates are then conveyed into the process space 34 and pass sequentially through the segments S1, S2, S3 and S4 where they are regenerated.

In the region of the segment S1, the substrates 2 are exposed to electromagnetic radiation from the longitudinal lamps 42. Here, the substrates 2 are illuminated from above via the longitudinal lamps 42, whereby a very strong illumination with an intensity in the range of greater than 8,000, in particular greater than 9,000 Watt/m$^2$, preferably above 12,000 Watt/m$^2$ is provided. In this segment the horizontal partition element 23 is preferably substantially transparent over the entire spectrum of the longitudinal lamps 42. The resulting strong radiation can heat the substrates 2 to an elevated temperature. Such heating could optionally also be assisted by a heating unit, such as the optional heating unit 46, which, for example, heats the bottom plate and the conveyor belt in contact therewith. The heating plate 46 is particularly useful when no sufficiently rapid heating takes place via the electromagnetic radiation of the longitudinal lamps 42 alone.

It is also possible that the substrates 2 already have an elevated temperature at the entrance of the segment S1 such that further heating is not desirable or even a cooling of the substrate is desired. Such a situation is for example in particular conceivable, when the substrates, are directly loaded into the segment S1 of the regeneration device 1 according to the invention, after leaving a firing furnace—for the purpose of firing the electrical contacts. At the exit of the firing furnace, the temperature of the substrates is often still at 400° C. or even higher, even though depending on the design of the cooling section of the firing furnace also lower temperatures are possible. In such a case, for example, instead of a heating plate 46, a temperature control unit may be provided which, for example, acts on the base plate 40 and the conveyor belt 36 in contact therewith and thus on the substrates 2. By way of example, such a temperature control unit may have a medium having a substantially controlled temperature flow therethrough in order to supply or remove heat to/from the substrate as required.

At the and of the segment S1, the substrates 2 should have a temperature preferably above 230° C., in particular above 250° C., for example in the range of 250-280° C., independently of the initial temperature of the substrates 2. If the substrates need to be heated in segment S1, the entire wavelength spectrum of the longitudinal lamps is typically used in segment S1 to provide radiation heating, which may optionally be assisted by the heating plate 46. This leads to a rapid heating and can thus provide an overall shortened process time. The strong heating under illumination leads to rapid formation of the recombination-active boron-oxygen defects, and in particular to a complete activation of all boron-oxygen defects at this time. In addition, excess charge carriers are generated in the substrate 2 and H atoms, which are usually present in the form H$^+$, are activated so that they are increasingly present in the term H$^0$ and H$^-$. In this form, they are better suited to settle at neutral or positively charged defects or lattice defects within the substrate 2 and to permanently passivate the same, which is also referred to as regeneration.

Similar effects arise even if the substrates 2 in segment S1 do not need to be heated, need only little heating or even cooling. Also here, the irradiation in segment S1 leads to the rapid formation of the recombination-active boron-oxygen defects as well as the other effects mentioned above. In particular, when substantial heating is not required, the illumination can be chosen or adjusted so that primarily radiation with a radiation spectrum below 1200 nanometers fails onto the substrates 2, since this radiation (besides the temperature) is primarily responsible for the effects.

The substrates 2 are then moved through the segment S2 of the process space 34, wherein the lamp power guided from above onto the substrates 2 is still maintained in a range of more than 8000 Watt/m$^2$, preferably above 9000 Watt/m$^2$. In order to prevent further heating of the substrates 2 by the large radiation power, the substrates are cooled from below. This is done via the cooling plate 47, which cools the bottom plate 40 in this region, over which the conveyor belt 36 moves. Because the conveyor belt 36 is in direct contact with the bottom plate 40, a respective backside cooling of the substrates 2 can be provided. In this region, a further heating of the substrates 2 is not desired, but rather a temperature plateau (within a temperature range) should be achieved. The preferred temperature range for the regeneration of boron-oxygen defects is greater than 230° C. up to 300° C. When passivating multi-crystalline Si, the temperature range may be above 300° C. Therefore, in this region, part of the spectrum of the lamp radiation is filtered out via the vertical partition element 23, which is formed as a filter element in this region. In particular, wavelengths in the range of >1200 nanometers can be filtered out. The wavelengths below 1200 nanometer contribute to the generation of excess charge carriers, while wavelengths above 1200 nanometer would not contribute to this effect but would primarily contribute to heating. In the segment S2, a profile is set between Δn (excess charge carriers, generated by irradiation) and temperature T. This can be different for different types of solar cells, and can be determined by appropriate preceding tests. For each type of solar cell, there is an optimal profile of Δn and T, which depends among other things on the hydrogen content, the diffusivity (contamination, defects) and the like, as the skilled person will recognize. The Δn achievable by the irradiation depends from the solar cell itself (recombination in the body and on both surfaces). In particular, lower quality solar cells require more irradiation to obtain a desired Δn.

As mentioned earlier, the optimal profile of Δn and T can be determined in preceding tests. Only the inventive combination of cooling and heating and optionally a filter, which is provided for example in the segments S2 to S4 by the horizontal partition element 23, makes it possible to set this optimal profile for a given light source.

Since strong irradiation of >8000 Watt/m$^2$ is still used in the second segment, active backside cooling is required to prevent the temperature of the substrate from rising above a desired level. Below the bottom plate, a temperature sensor is provided, which measures the temperature of the bottom plate 40, preferably centrally between the two side by side tracks covered by the substrates when moving through the segment. An offset between see the temperature of the underside of the bottom plate 40 and the temperature of the substrates 2 is substantially known, and therefore a temperature control may be achieve via respective calculations. As can be seen, the offset depends inter alia on the speed of the conveyor belt 36 and the lamp power of the longitudinal lamps 42, which are usually kept constant.

If there is a risk of overheating the substrates 2 the lamp power can be reduced. The lamps respond quickly and can therefore be used for rapid control. Overheating would for example quickly occur when the running speed of the conveyor belt 36 slows down, as for example caused by an error, or when distances between successive substrates 2 become too large, or when the arrangement of the substrates on the conveyor belt 36 is outside of a normal arrangement. Other factors can also lead to a potential overheating, which can be avoided by a respective control of the longitudinal lamps.

Due to the high radiation power also in the segment 2, an additional cooling plate 51 is also provided in the upper cooling channel, in order to avoid excessive heating of the housing. The irradiation leads to setting a desired profile of Δn and T in order to achieve an as complete as possible regeneration (passivation of defects) within the substrate.

A further treatment can also be carried out in segment S3. However, in the present embodiment, the radiation power can already be reduced in segment S3, in particular to a range below 8000 Watt/m$^2$. The substrates are still maintained at the desired Δn-temperature profile as they are being conveyed through segment S3. In the segment S4, the radiation power is further reduced, and the substrates are actively cooled while still being irradiated, in particular, the substrates are cooled to temperatures below 150° Celsius. In each of the different segments, with the exception of segment S4, the maximum radiation power may be applied as long as there is no risk of overheating. A reduction of the radiation power in S4 is only necessary to the extent that at the end of the segment a temperature of below 150° C. can be reached.

At the outlet end of the process space 34, the substrates 2 can then be unloaded in a suitable manner.

Throughout the process, the upper cooling channel, the middle cooling channel, the lamp receiving channel and the lateral cooling channels are cooled by the blower 51 via the air flow principle. Depending on how strong the lamp power is set in the segments S3 and S4, it may be beneficial to additionally use cooling plates in this region of the upper cooling channel in order to avoid overheating of the outer housing 13. During the passage of the substrates 2 through the process space 34, the apparatus 1 initially enables a good activation of the substrates by irradiation via the overhead longitudinal lamps 42. In addition the temperature of the substrates 2 may be controlled or increased. Heating can for example be achieved by an active intensive radiation heating via the overhead longitudinal lamps 42, as well as by an optional additional contact heating via the heating plate 46. In the case of active heating, preferably the full spectrum of the lamp radiation is available in order to allow particularly rapid heating. Depending on the inlet temperature of the substrates 2, however, the temperature control can also include maintaining the temperature, a slight heating or a cooling of the substrates 2, which may for example be achieved, by means of a temperature control unit which is controlled or regulated to a substantially constant temperature.

In the segments S2 to S4, a contact cooling is provided via the backside of the substrates to counteract a heating via the longitudinal lamps, which are still operated with strong power. Wavelengths in the range above about 1200 nanometers are additionally filtered out before the radiation falls onto the substrates 2. This can be done by the horizontal partition element 23, which can be formed as a filter plate in this region. It would also be possible to receive the longitudinal lamps in appropriate filter tubes or to provide special radiation sources which emit in the desired radiation spectrum below 1200 nanometers. In this case it is necessary that the respective radiation sources can provide sufficient light intensity in the range of more than 8000 Watt/m$^2$. The different areas of the apparatus 1 outside the process space 34 can be brought to a desired temperature via different mechanisms, such as the blower or the additional cooling plates 50, 51.

In the illustrated embodiment, the bottom plate 40 is formed as a graphite plate in all segments. It is also possible to form the bottom plates in the different segments from different materials. In particular, it is for example possible to provide a graphite plate in segment S1 and an aluminum plate in the other segments. This could possibly reduce the required cooling power required for cooling the cooling plates 46 to 48. A graphite plate could be heated substantially by the longitudinal lamps 42, in particular when the conveyor belt is not fully loaded with substrates, which would require additional cooling. On the other hand, if the bottom plates in this area were formed as aluminum plates, the plates would reflect a larger portion of the lamp radiation and would thus be less heated. When rapid heating is desired in segment S1, absorption of the radiation by the bottom plate would not be detrimental here. However, assuming that during operation a very close occupancy of the conveyor belt is provided and in view of the good sliding properties, graphite is currently preferred for the bottom plate 40.

Furthermore, sensors are provided at the entrance area of the apparatus 1, which detect the occupancy of the substrates on the conveyor belt 36. In particular, when large gaps are present between successive substrates, overly large heating of the bottom plate 40 can be prevented by an appropriate control of the longitudinal lamps 42. In particular, the radiation power can be reduced when larger distances occur between successive substrates, which ma for example be caused by a fault in the loading mechanism.

The inventive method has been described in combination with the apparatus according to the invention, which is configured as a continuous furnace. However, the method can also be performed irrespective of the specific apparatus, for example, in a stationary oven, such as a rapid thermal processing system (RTF-system). In this case, filtering of the radiation spectrum to the Δn(H$^0$)-activating region may for example be achieved via movable filter elements, which can also be referred to as a shutters. The invention has been explained in detail above with reference to preferred embodiments of the invention, without being limited to the specific embodiments.

The invention claimed is:

1. A method for passivating defects of a semiconductor substrate, in particular a silicon-based solar cell, the method comprising the following steps:

heating the substrate during a first process phase by means of at least electromagnetic radiation, wherein the radiation directed onto the substrate has at least wavelengths in a range below 1200 nm and an intensity of at least 8000 Watt/m$^2$;

irradiating the substrate with electromagnetic radiation during a temperature-holding phase following the heating phase, wherein the radiation directed onto the substrate has wavelengths primarily in the range below 1200 nm and an intensity of at least 8000 Watt/m$^2$;

cooling a side of the substrate facing away from a source of electromagnetic radiation during the temperature-holding phase via contact with a support, which is cooled by a cooling device; and following the temperature-holding phase with a cooling phase, in which the substrate is cooled at least via contact with a support, which is cooled by a cooling device, while the substrate is further irradiated with electromagnetic radiation having wavelengths primarily in the range below 1200 nm.

2. The method according to claim 1, wherein the intensity of the electromagnetic radiation in the first process phase and/or the temperature-holding phase is at least 9000 Watt/m$^2$, in particular at least 10000 Watt/m$^2$.

3. The method according to claim 1, wherein the intensity of the radiation during the first process phase is higher than during the temperature-holding phase, in particular by at least a factor of 1.3.

4. The method of claim 1, wherein the substrate is additionally heated during the heating phase via contact with a support, which is heated by a heating device.

5. The method according to claim 1, wherein for the first process phase and the temperature-holding phase, the same type of radiation source is used, wherein at least during the temperature-holding phase, a part of the spectrum of the radiation source is filtered, so that the radiation incident on the substrate has wavelengths primarily below 1200 nm.

6. The method according to claim 1, wherein the substrate is irradiated by types of radiation sources during the first process phase that are different than those of the temperature-holding phase and/or the cooling phase.

7. The method according to claim 1, wherein during the first process phase the substrate is at least partially heated by contact with a support, which is heated by a heating device.

8. A method for passivating defects of a semiconductor substrate, in particular a silicon-based solar cell, the method comprising the following steps:
controlling the temperature of the substrate during a first process phase via contact with a temperature controlled support, while electromagnetic radiation is directed onto the substrate, wherein the radiation directed onto the substrate has at least wavelengths in the range below 1200 nm and an intensity of at least 8000 Watt/m$^2$;
irradiating the substrate with electromagnetic radiation during a temperature-holding phase following the first process phase, wherein the radiation directed onto the substrate has wavelengths primarily in the range below 1200 nm and an intensity of at least 8000 Watt/m$^2$;
cooling a side of the substrate facing away from a source of electromagnetic radiation during the temperature-holding phase via contact with a support, which is cooled by a cooling device; and
following the temperature-holding phase with a cooling phase, in which the substrate is cooled at least via contact with a support, which is cooled by a cooling device, while the substrate is further irradiated with electromagnetic radiation having wavelengths primarily in the range below 1200 nm.

9. The method of claim 8, wherein the substrate is irradiated during the first process phase with electromagnetic radiation having wavelengths primarily in the range below 1200 nm.

10. The method of claim 8, wherein the electromagnetic radiation in the heating phase has a substantial proportion of radiation having wavelengths above 1200 nm.

11. The method according to claim 8, wherein the intensity of the electromagnetic radiation in the first process phase and/or the temperature-holding phase is at least 9000 Watt/m$^2$, in particular at least 10000 Watt/m$^2$.

12. The method according to claim 8, wherein the intensity of the radiation during the first process phase is higher than during the temperature-holding phase, in particular by at least a factor of 1.3.

13. The method according to claim 8, wherein for the first process phase and the temperature-holding phase, the same type of radiation source is used, wherein at least during the temperature-holding phase, a part of the spectrum of the radiation source is filtered, so that the radiation incident on the substrate has wavelengths primarily below 1200 nm.

14. The method according to claim 8, wherein the substrate is irradiated by types of radiation sources during the first process phase that are different than those of the temperature-holding phase and/or the cooling phase.

15. The method according to claim 8, wherein during the first process phase the substrate is at least partially heated by contact with a support, which is heated by a heating device.

16. An apparatus for regenerating a semiconductor substrate, in particular a silicon-based solar cell, comprising:
a continuous furnace having an elongated process space, which forms at least three zones arranged in the sequence of a first process zone, a temperature-holding zone, and cooling zone;
at least one transport unit for receiving the substrate and for transporting the substrate successively through the zones of the process space;
at least one first radiation source for electromagnetic radiation, which is arranged adjacent to the first process zone of the process space such that it can radiate electromagnetic radiation onto a section of the transport unit located in the first process zone, and which is configured to generate radiation having wavelengths at least in the range below 1200 nm and an intensity of at least 8000 Watt/m$^2$;
at least one second radiation source for electromagnetic radiation, which is arranged adjacent to the temperature-holding zone of the process space such that it can radiate electromagnetic radiation onto a section of the transport unit located in the temperature-holding, and which is configured to generate radiation having wavelengths at least in the range below 1200 nm and an intensity of at least 8000 Watt/m$^2$;
at least one first cooling unit, which is arranged in the temperature-holding zone of the process chamber and is in heat-conducting contact with the section of the transport unit located in the temperature-holding zone.

17. The apparatus according to claim 16, further comprising a temperature control unit, which is arranged in the first process zone of the process space and is in heat-conducting contact with a section of the transport unit located in the heating zone.

18. The apparatus according to claim 17, wherein the temperature control unit is a heating unit.

19. The apparatus according to claim 16, wherein the first process zone is formed as a heating zone.

20. The apparatus of claim 16, further comprising:
at least one third radiation source for electromagnetic radiation, which is arranged adjacent to the cooling zone of the process space such that it can radiate electromagnetic radiation onto a section of the transport unit located in the cooling zone, and which is configured to generate radiation having wavelengths at least in the range below 1200 nm; and
at least one second cooling unit, which is arranged in the cooling zone of the process chamber and is in heat-conducting contact with the section of the transport unit located in the cooling zone.

21. The apparatus according to claim 16, wherein a filter unit is provided between at least one of the following, the first, the second and third radiation source and the process space, which filters out at least a portion of the radiation of the second and/or third radiation source, which is directed into the process space radiation, in particular wavelengths in the range above 1200 nm.

22. The apparatus to claim 16, further comprising at least one heating unit, which is arranged in the heating zone of the process space and is in heat-conducting contact with a section of the transport unit located in the heating zone.

23. The apparatus according to claim 16, wherein the transport unit comprises conveyor belt, which is guided in a circulating manner through the zones of the process space and which is in sliding contact with at least one plate member in the process space, wherein the at least one plate member is in thermally conductive contact with at least one of the following: the first cooling unit, the second cooling unit and the heating unit.

24. The apparatus according to claim 23, wherein the conveyor belt is at least partially received and guided in the at least one plate member.

25. The apparatus according to claim 16, wherein separate plate elements are provided in at least in the heating zone and the temperature-holding zone, which separate plate elements are not in thermally conductive contact with each other.

26. The apparatus according to claim 16, wherein the first cooling unit and/or the second cooling unit are liquid cooled units.

27. The apparatus according to claim 16, wherein the first, second and/or third radiation source comprises at least one halogen lamp and/or gas discharge lamp, which is configured to generate radiation with an intensity of at least 9000 Watt/m$^2$, in particular of at least 10,000 Watt/m$^2$ on a section of the transport unit located in the respective zone.

28. The apparatus according to claim 16, wherein at least two of the first, second and third radiation sources are of a different type.

* * * * *